United States Patent
Shiba et al.

(10) Patent No.: US 7,876,031 B2
(45) Date of Patent: *Jan. 25, 2011

(54) PIEZOELECTRIC THIN-FILM ACOUSTIC WAVE DEVICE AND INFORMATION PROCESSING UNIT USING THE SAME

(75) Inventors: Takashi Shiba, Oshu (JP); Kazuo Tsubouchi, Sendai (JP); Kensei Uehara, Sendai (JP); Hiroyuki Nakase, Sendai (JP); Suguru Kameda, Sendai (JP); Yoji Isota, Sendai (JP); Yasuo Cho, Sendai (JP)

(73) Assignee: Hitachi Media Electronics Co., Ltd., Iwate (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/608,843

(22) Filed: Oct. 29, 2009

(65) Prior Publication Data

US 2010/0045138 A1 Feb. 25, 2010

Related U.S. Application Data

(63) Continuation of application No. 11/442,355, filed on May 30, 2006, now Pat. No. 7,714,485.

(30) Foreign Application Priority Data

May 31, 2005 (JP) ............................. 2005-158300

(51) Int. Cl.
*H01L 41/18* (2006.01)
(52) U.S. Cl. ....................................... 310/357
(58) Field of Classification Search ................. 310/311, 310/357
See application file for complete search history.

(56) References Cited

U.S. PATENT DOCUMENTS 4,356,424 A 10/1982 Marcus (Continued)

FOREIGN PATENT DOCUMENTS

JP 2005072409 3/2005

OTHER PUBLICATIONS

Measurements of the Bulk, C-Axis Electromechanical Coupling Constant As A Function Of AlN Film Quality, Naik et al, IEEE Transactions on Ultrasonics, Ferroelectrics, and Frequency Control, vol. 47, No. 1, Jan. 2000 pp. 292-296.

(Continued)

*Primary Examiner*—Walter Benson
*Assistant Examiner*—Derek J Rosenau
(74) *Attorney, Agent, or Firm*—Antonelli, Terry, Stout & Kraus, LLP.

(57) ABSTRACT

A piezoelectric thin-film acoustic wave device formed of a piezoelectric thin film of AlN on the +C plane and having the polarization strength of not lower than $0.63 \times 10^{-20}$ F/V and an information processing unit using the same are disclosed. This is the result of the inventors having studied the factors other than the C-axis orientation affecting the electromechanical coupling factor and developing a method of improving the electromechanical coupling factor in view of the occasional fact that the electromechanical coupling factor cannot be improved by improving the C-axis orientation and the electromechanical coupling factor required for the piezoelectric thin-film acoustic wave device is not obtained. In such a case, the receiving sensitivity of the receiving system may be deteriorated and the transmission strength of the transmission system is required to be increased undesirably having an adverse effect on the power saving efforts.

8 Claims, 10 Drawing Sheets

U.S. PATENT DOCUMENTS

| | | |
|---|---|---|
| 6,218,770 B1 | 4/2001 | Ando et al. |
| 6,590,336 B1 | 7/2003 | Kadota |
| 6,858,969 B2 * | 2/2005 | Bi et al. .................. 310/313 R |
| 2004/0012463 A1 | 1/2004 | Kawakubo et al. |
| 2004/0135144 A1 | 7/2004 | Yamada et al. |
| 2004/0227590 A1 | 11/2004 | Larson et al. |

OTHER PUBLICATIONS

Office Action issued for the counterpart Japanese Application as of Jun. 29, 2010.

* cited by examiner

| | NH₃ ANNEALING | AlN FILM FORMING CONDITIONS |
|---|---|---|
| FILM FORMING CONDITION 1 | NIL (INTRODUCE NH₃ 10 secs. AFTER TMA) | SUBSTRATE TEMP: 600°C |
| FILM FORMING CONDITION 2 | SUBSTRATE TEMP: 600°C, TIME: 1 min | SUBSTRATE TEMP: 600°C |
| FILM FORMING CONDITION 3 | SUBSTRATE TEMP: 1200°C, TIME: 1 min | SUBSTRATE TEMP: 600°C |
| FILM FORMING CONDITION 4 | SUBSTRATE TEMP: 1200°C, TIME: 1 min | SUBSTRATE TEMP: 1200°C |

PIEZOELECTRIC THIN-FILM ACOUSTIC WAVE DEVICE AND INFORMATION PROCESSING UNIT USING THE SAME

INCORPORATION BY REFERENCE

The present application is a Divisional application of U.S. patent application Ser. No. 11/442,355, filed on May 30, 2006, now U.S. Pat. No. 7,714,485 which claims priority from Japanese application JP2005-158300 filed on May 31, 2005, the content of which is hereby incorporated by reference into this application.

BACKGROUND

This invention relates to a piezoelectric thin-film acoustic wave device and an information processing unit using the same.

In the conventional piezoelectric thin-film acoustic wave device as described in "IEEE Transactions on Ultrasonics, Ferroelectrics, and Frequency Control, Vol. 47, No. 1, January p. 292 (2000)", the loss of the piezoelectric thin-film acoustic wave device is considered to be effectively reduced with a large electromechanical coupling factor and a wide band, as a good orientation of the C axis of the crystal of the piezoelectric thin film is satisfactory.

SUMMARY OF THE INVENTION

A detailed study of the present inventors, however, shows that the electromechanical coupling factor may happen to be small in spite of a satisfactory orientation of C axis. Specifically, it sometimes happens that in spite of an improved orientation of C axis, the electromechanical coupling factor fails to be improved up to a level required as a piezoelectric thin-film acoustic wave device. In such a case, the loss of the piezoelectric thin-film acoustic wave device increases to such an extent that in an assumed application to a mobile communication unit, for example, the receiving sensitivity of the receiving system may be deteriorated and the transmission strength of the transmission system is required to be improved undesirably for saving power. In view of this, the present inventors have studied the factors affecting the electromechanical coupling factor other than the C-axis orientation and a method of improving the electromechanical coupling factor.

Accordingly, it is an object of this invention to provide a reliable piezoelectric thin-film acoustic wave device and an information processing unit using the same.

In order to solve the problem described above, according to this invention, there is provided a configuration described in the claims appended hereto.

According to this invention, it is possible to provide a reliable piezoelectric thin-film acoustic wave device and an information processing unit using the same.

DETAILED DESCRIPTION OF THE INVENTION

The present inventors have studied the factors other than the C-axis orientation affecting the electromechanical coupling factor and a method of improving the electromechanical coupling factor.

Figure 7:
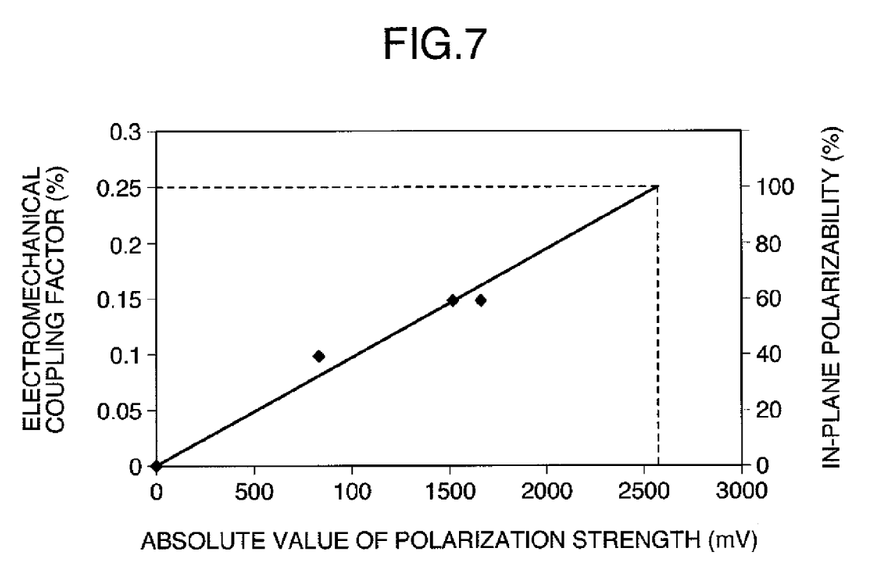
FIG. 7 is a graph showing the electromechanical coupling factor and the polarization strength.
Figure 8:
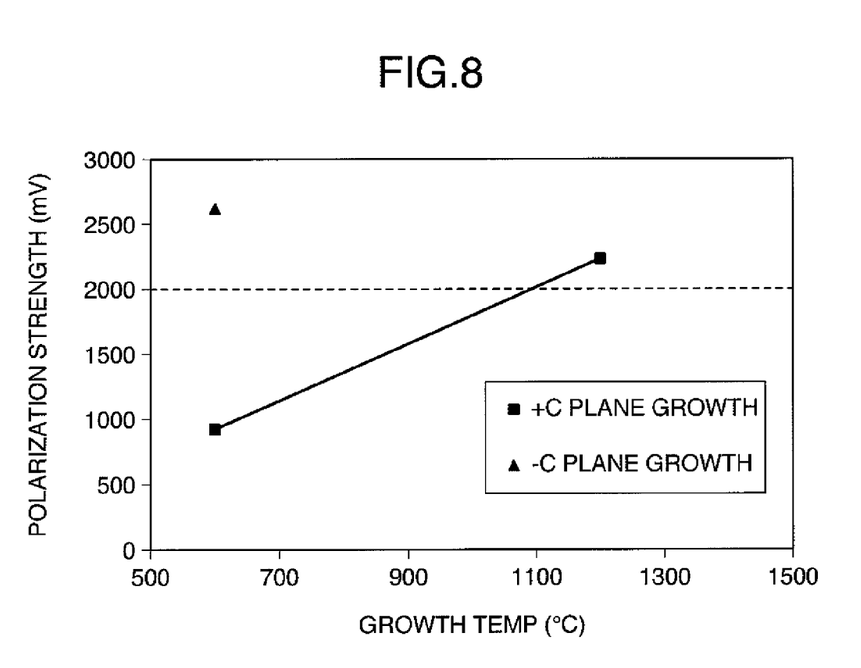
FIG. 8 is a graph showing the growth temperature and the polarization strength.

First, the inventors focused on the polarization strength as a factor affecting the electromechanical coupling factor other than the C-axis orientation. Specifically, the inventors conducted a verification test assuming that the polarization strength is a factor affecting the electromechanical coupling factor and studied the possibility of improving the electromechanical coupling factor by controlling the polarization strength. As a result, as shown in FIG. 7 (as described in detail later), it was made clear that the absolute value of the polarization strength and the electromechanical coupling factor are correlated to each other, and that the larger the polarization strength, the larger the electromechanical coupling factor. It was also discovered that the absolute value of the polarization strength is correlated with the growth temperature for the film forming process as shown in FIG. 8 (as described in detail later). Specifically, it became apparent that the absolute value of the polarization strength and hence the electromechanical coupling factor can be increased by controlling the growth temperature for the film deposition process.

Figure 11:
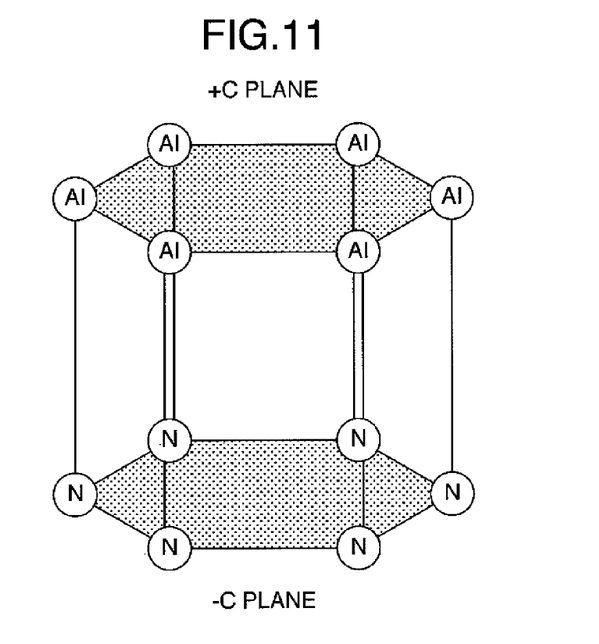
FIG. 11 is a diagram showing an AlN crystal structure.

The inventors also studied a method of improving the crystallinity of the piezoelectric thin-film acoustic wave device. A low crystallinity gives rise to the problem of displacement or dislocation of the crystal orientation, resulting in a smaller electromechanical coupling factor. As a result of the study by the inventors, it was discovered the degree of crystallinity depends on the plane where crystal is grown. Specifically, assuming an AlN crystal structure shown in FIG. 11, the crystallinity is varied between the +C plane growth and −C plane growth. Specifically, a more satisfactory crystal can be obtained in the case of +C plane growth than in the case of −C plane growth. A further study made clear that the polarity, i.e. +C plane growth or −C plane growth, depends on the initial nitriding for the film forming process. Specifically, the polarity, i.e. the +C plane growth or the −C plane growth can be controlled and the crystallinity can be improved for a larger electromechanical coupling factor depending on whether the initial nitriding is carried out or not. A detailed explanation is made below with reference to the drawings.

Figure 1:
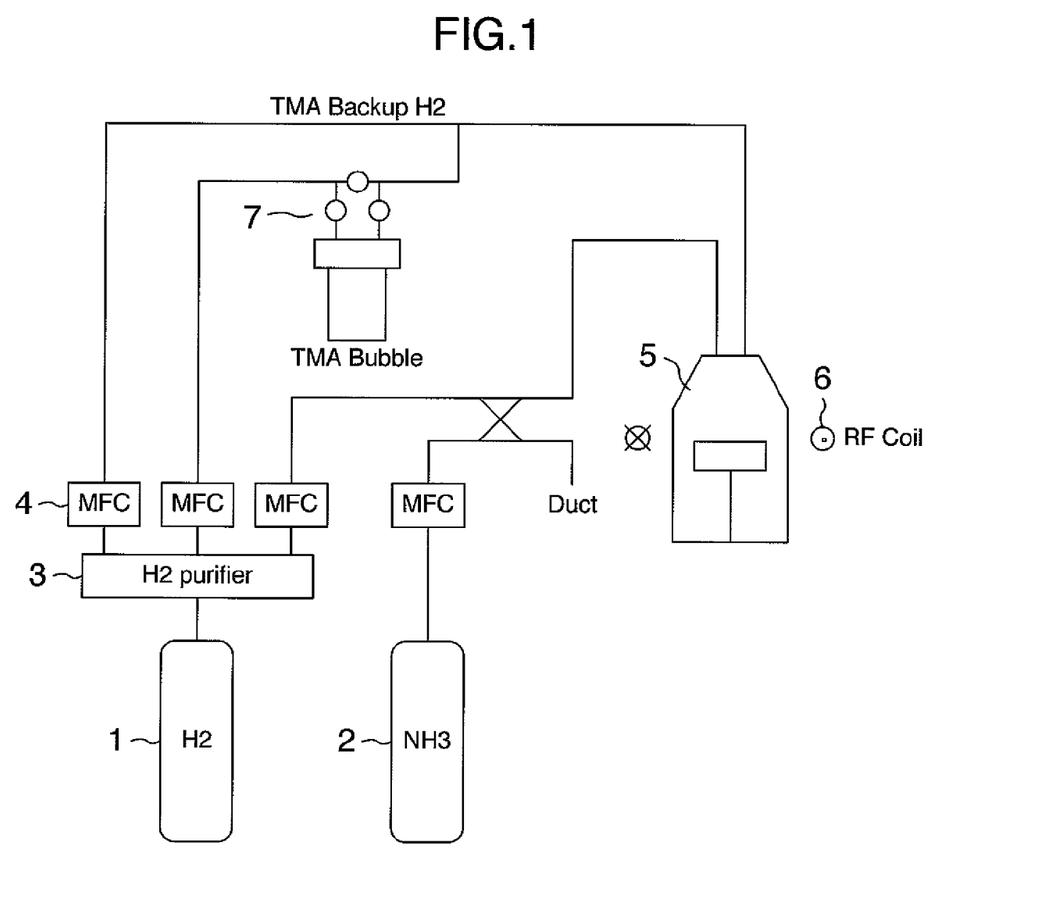
FIG. 1 is a diagram schematically showing a MOCVD apparatus.

First, the specifics of an experiment conducted to clarify the factors controlling the polarization strength and the polarity are explained. FIG. 1 is a schematic diagram showing an apparatus using MOCVD (metal organic chemical vapor deposition) to form the AlN film. Although a method is available in which ZnO or GaN is used instead of AlN, the method using AlN is explained in the case under consideration. In FIG. 1, ammonium gas ($NH_3$) or trimethyl aluminum (TMA) is used as a main material gas for the film forming process. Other conceivable materials include aluminum (Al) target, nitrogen gas ($N_2$) and AlN powder.

Reference numeral 1 designates a cylinder filled with hydrogen, and numeral 2 a cylinder filled with $NH_3$. Numeral 3 designates a refining unit for producing a high-purity hydrogen gas and is arranged immediately after the cylinders. Numeral 4 designates a mass flow controller for controlling the flow rate of each material. Numeral 5 designates a vertical reaction tube of quartz in which the film is formed by the reaction of the material gas. Numeral 6 designates a high-frequency frequency induction heater for heating the substrate. Other conceivable heating methods including the electro resistance heater. Numeral 7 designates a unit for bubbling TMA as one of the material gases with hydrogen gas to produce a gas phase while at the same time backing up the TMA gas with hydrogen gas and transporting it to a reaction tube. To avoid reaction in the piping, $NH_3$ and TMA are transported through different pipes and mixed in the reaction tube.

The inventors, paying attention to the conditions for AlN growth temperature and $NH_3$ annealing (initial nitriding) as factors controlling the polarization strength and the polarity, conducted the verification under various film forming conditions using the test equipment shown in FIG. 1. The initial nitriding is defined as a state in which the surface of a substrate (thin film formed in the initial stage) is nitrided before growing the AlN thin film.

Figure 10:
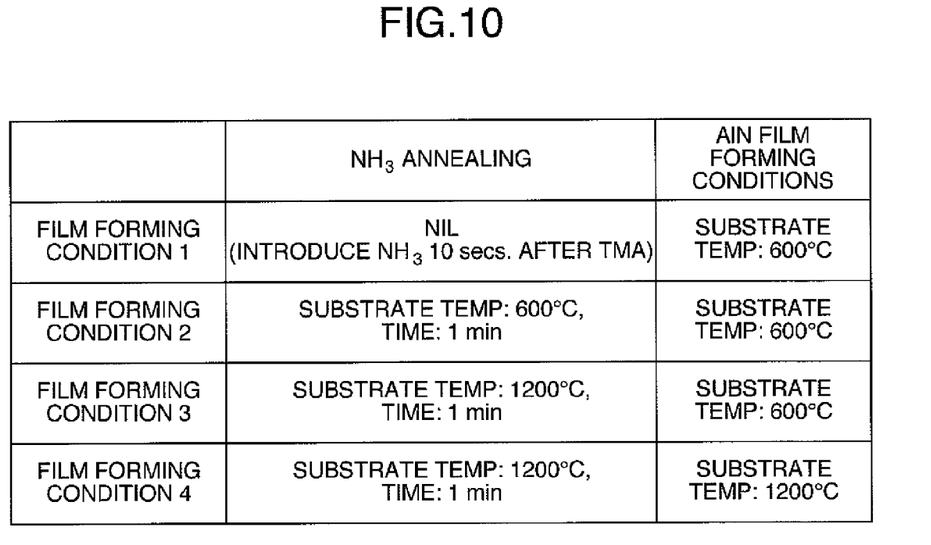
FIG. 10 is a diagram showing the AlN film forming conditions.

FIG. 10 shows the conditions for forming an AlN film. The film forming condition 1, or film deposition condition, represents the case free of initial nitriding. In this case, TMA is introduced after hydrogen annealing, and $NH_3$ is introduced 10 seconds later. The film forming condition 2 concerns the case in which the $NH_3$ annealing process is carried at the substrate temperature of 600° C. and the AlN film is formed at 600° C. A higher temperature may be employed. The film forming condition 3 represents the case in which the $NH_3$ annealing is conducted at 1200° C. and the AlN film is formed at 600° C. The film deposition condition 4 represents the case in which the $NH_3$ annealing process is carried out under the same condition as the film deposition condition 3, i.e. at the temperature of 1200° C., and the AlN film is formed at 1200° C. Instead of the temperatures of 600° C. and 1200° C. employed as an example of the image forming conditions in the aforementioned cases, the temperatures of not lower than 600° C. and not lower than 1200° C., respectively, may alternatively be employed.

Figure 4:
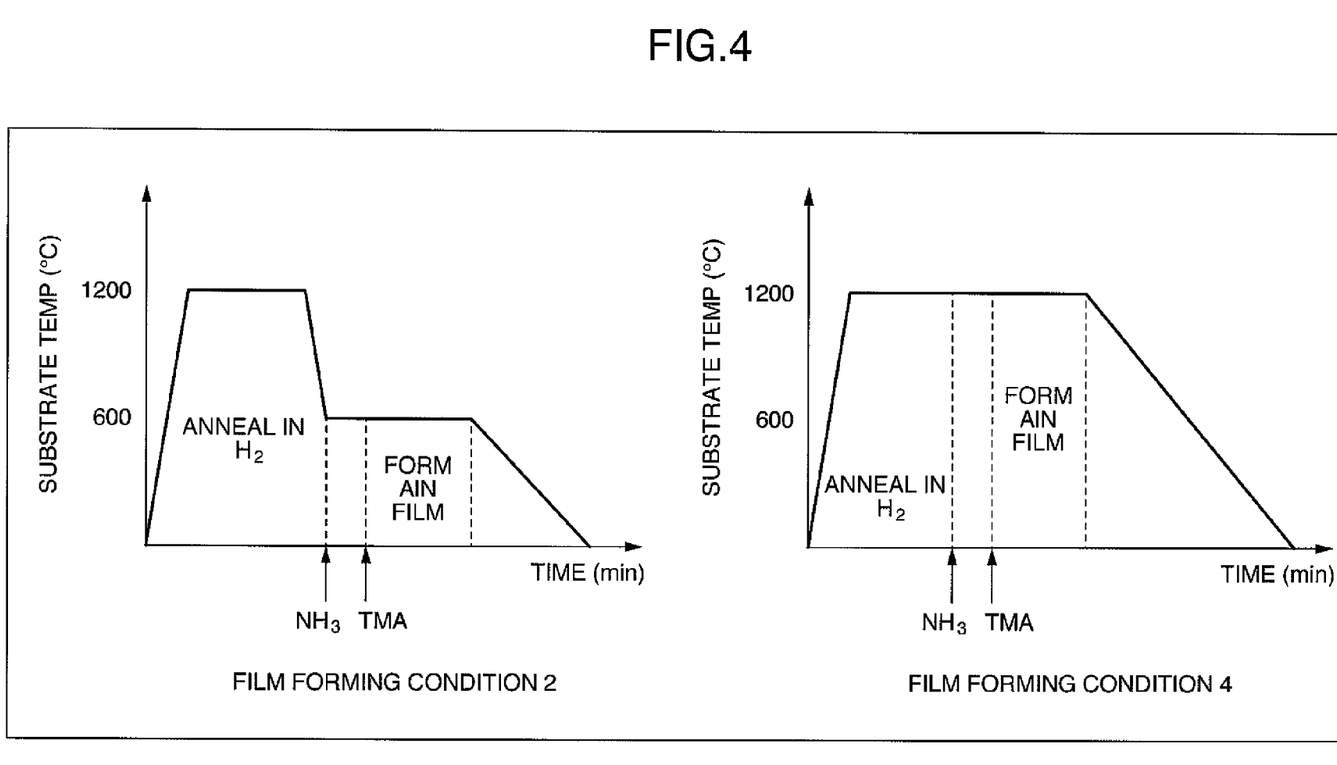
FIG. 4 is a diagram showing the film forming conditions 2 and 4 in FIG. 10.

FIG. 4 shows the experiments conducted under the film forming conditions 2 and 4. The abscissa represents the time elapsed, and the ordinate the substrate temperature. In all film conditions, the substrate is heated by increasing the temperature as quickly as possible to accurately control the hydrogen annealing process. After deposition of the film, on the other hand, the temperature is decreased slowly over a long time to suppress the residual distortion as far as possible.

Figure 5:
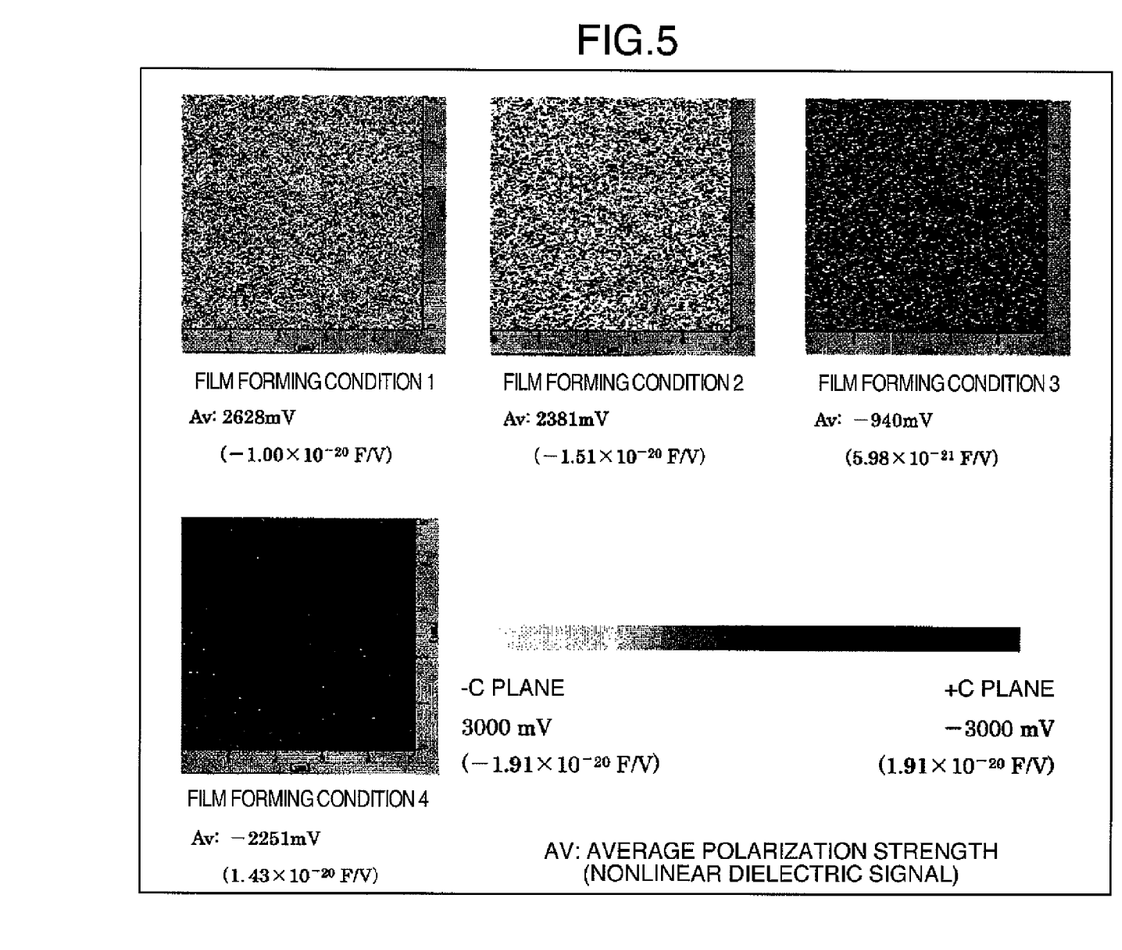
FIG. 5 shows a SNDM image of an AlN film under the film forming conditions in FIG. 10.

The result of measurement by the scanning nonlinear dielectric microscope (SNDM) under the film forming conditions 1 to 4 shown in FIG. 10 is illustrated in FIG. 5. In FIG. 5, the low color density indicates the –C plane growth, and the high color density the +C plane growth. The average value Av of the polarization strength is the result of measurement by SNDM, and the larger the absolute value of the average value Av, the larger the polarization strength.

The polarization strength in terms of m/V and F/V is described below.

The term m/V is the unit of an output signal (Vout) of a lock-in amplifier directly obtained by measurement in the SNDM measurement system. This signal is varied depending on the measurement conditions even with the same sample and not widely used. In other words, the same value can be obtained even for different samples by adjusting the measurement conditions. The relative evaluation is possible with this output signal for the same sample under the same measurement conditions. Under different conditions for the same sample, however, the evaluation should be based on the output taking the measurement conditions into consideration. The signal strength (Ig) taking the measurement parameters into consideration is given by Equation 1 below.

$$Ig = \frac{\frac{V_{out}}{10} \times \frac{S_v}{1000} \times \frac{\sqrt{2}}{4} \times R_g}{\frac{V_a}{2}} \times 1000 \quad [Hz/V]$$

where Sv is the sensitivity in mV of the lock-in amplifier, Rg the range in kHz of the FM demodulator, and Va the voltage in V applied to the sample. This signal strength of course reflects the nonlinear dielectric constant. The evaluation more widely used with different materials is by deriving the tertiary nonlinear dielectric constant ($\varepsilon^{ui}(3)$) [F/V]. This evaluation using a reference sample (with a known nonlinear dielectric constant) is expressed as follows.

$$\varepsilon^{ui}(3) = \varepsilon^{st}(3) \times \frac{S_{nl}(\varepsilon^{st}(2))}{S_{nl}(\varepsilon^{ui}(2))} \times \frac{\Delta f_d^{ui}}{\Delta f_d^{st}} \times \left(\frac{f_s^{st}}{f_s^{ui}}\right)^3 \quad [F/V] \quad (3)$$

$$\Delta f_d = I_g \times V_{out}$$

where affixes "st" and "ui" designate a reference sample and a measurement sample, respectively, $\varepsilon^{st}(3)$ the nonlinear dielectric constant [F/V] of the reference sample which is the negative plane of Z-cut $LiTaO_3$ having the value of $-2.26 \times 10^{-19}$ in this case, and $Sn1(\varepsilon(2))$ the capacitance change susceptibility per unit nonlinear dielectric constant which is the function of only the relative dielectric constant $\varepsilon(2)$. The capacitance change susceptibility ($Sn1(\varepsilon^{st}(2))$) of the reference sample is 0.17075, and the capacitance susceptibility ($Sn1(\varepsilon^{ui}(2))$) of the measurement sample is 0.199927 which is a value calculated using the relative dielectric constant of sapphire. Also, "fs" is the resonance frequency changed by the capacitance generated in the neighborhood of the sample surface and a probe when the probe is brought into contact with the sample. The polarization strength expressed in terms of "%" is explained below.

This expression is defined as a polarizability in the sample plane. The electromechanical coupling factor 0.25% of the C-plane AlN film is assumed to be the in-plane polarizability of 100% (FIG. 7). In view of these facts, the result of an experiment under each film forming condition is explained below. Specifically, with regard to the film forming condition 1, the AlN film formed is found to have grown on the –C plane with the polarization strength of 2628 mV (or $-1.00 \times 10^{-20}$ F/V). Also, with regard to the film forming condition 2, the –C plane growth is involved with the polarization strength of 2381 mV (or $-1.51 \times 10^{-20}$ F/V). In other words, a substantially similar result is obtained with the –C plane growth in the case where the NH$_3$ annealing is not conducted and in the case where the NH$_3$ annealing is conducted at 600° C. With regard to the film forming condition 3, it is found that the +C plane growth is involved. Comparison with the film forming condition 2 shows that the change occurs from −C to +C plane growth by the NH$_3$ annealing at 1200° C. Further, with regard to the film forming condition 4 at the growth temperature of 1200° C., the +C plane growth is involved with a higher polarization strength.

From the facts described above, it has become apparent that the polarization strength can be increased by a higher growth temperature. Also, the AlN film having a high crystallinity with the −C plane growth has yet to be reported, and the +C plane growth improves the characteristics of a device in applications. It is considered desirable, therefore, to increase the polarization strength by causing the +C plane growth by the initial nitriding while at the same time increasing the growth temperature.

Figure 2:
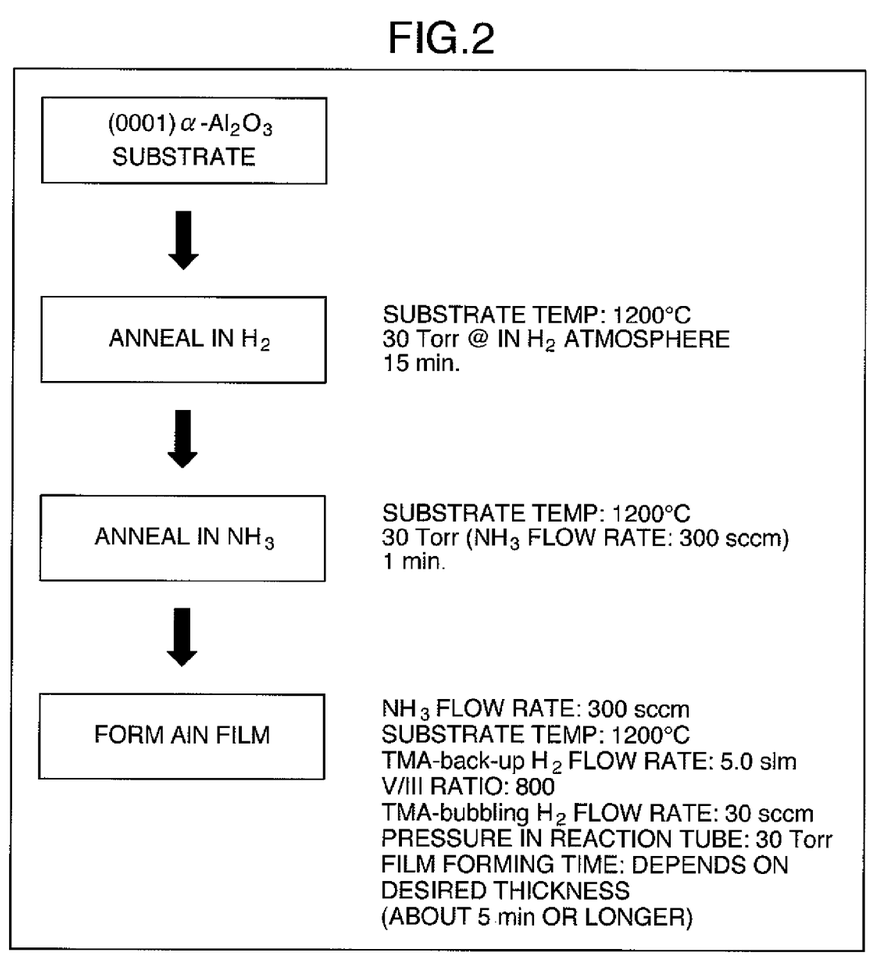
FIG. 2 is a diagram showing typical conditions and procedure for forming a film.

Next, the result of a verification test conducted based on the foregoing study is explained. FIG. 2 shows an example of typical film forming conditions and a typical film forming method according to this embodiment. The substrate is formed of sapphire.

First, the annealing in a hydrogen atmosphere is carried out to clean the oxide layer and the damaged layer on the substrate surface. The hydrogen annealing is conducted at the substrate temperature of 1200° C. for 15 minutes in a hydrogen atmosphere under the inner pressure of 30 Torr of the reaction tube. After the hydrogen annealing, NH$_3$ is introduced and the initial nitriding of the substrate surface is conducted for one minute. The substrate temperature is set to 1200° C., the NH$_3$ flow rate to 300 sccm and the internal pressure of the reaction tube to 30 Torr. After the initial nitriding, TMA is introduced to form an AlN film. The film forming conditions are shown in FIG. 2.

Figure 3:
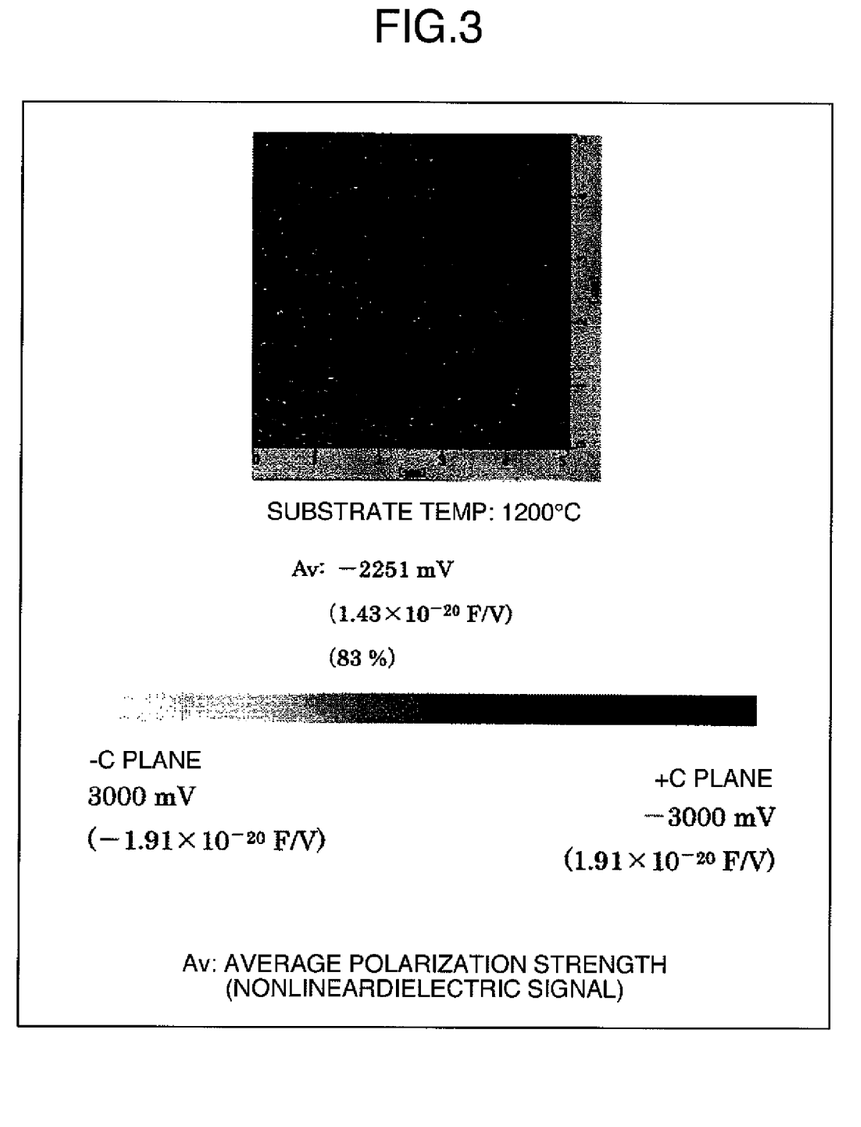
FIG. 3 shows a SNDM image of an AlN film under the conditions shown in FIG. 2.

FIG. 3 shows the polarity of the AlN formed under the conditions shown in FIG. 2 and the result of polarization strength measurement. As shown in FIG. 3, the AlN film formed has grown on C plane, of which the average value of the output signal (indicating the polarization strength) under SNDM with the +C plane growth is −2251 mV (or 1.43×10−20 F/V or 83%). This is a comparatively large value in terms of an absolute value of the polarization strength of the AlN film, and therefore a sufficient electromechanical coupling factor is obtained, while the +C plane growth produces a satisfactory crystal.

Figure 6:
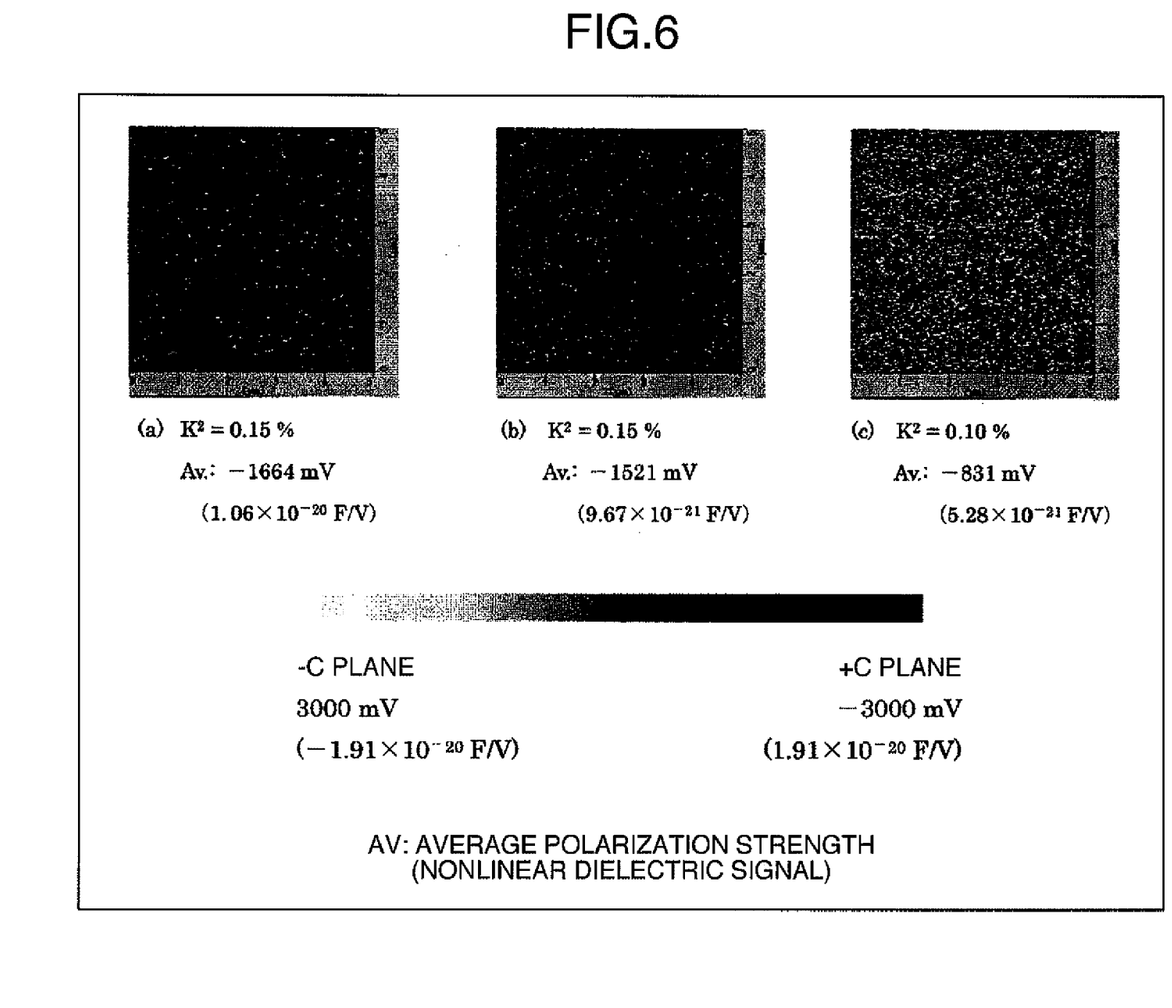
FIG. 6 is a diagram showing the relation between the electromechanical coupling factor and the polarization strength as observed under SNDM.

The relation between polarization strength and electromechanical coupling factor $K^2$ and the relation between growth temperature and polarity are described in detail with reference to FIGS. 6 to 8. As shown in FIG. 10, AlN is polarized considerably in the direction of +C axis or −C axis. The presence of C axis inverted in the plane generates the polarization in the opposite direction, resulting in the piezoelectricity being offset. This is considered to deteriorate the electromechanical coupling factor constituting the conversion efficiency. The measurement under SNDM was conducted, therefore, for purposes of confirming the distribution of the polarity inversion and evaluating the relation between polarization strength and electromechanical coupling factor. The measurement result is shown in FIG. 6. The measurement was using a sample (a) about 0.15% in $K^2$, a sample (b) about 0.15% in $K^2$ (different from sample (a)) and a sample (c) about 0.1% in $K^2$. A similar polarization strength is exhibited by the samples (a) and (b) having the same value $K^2$. The larger the value $K^2$, the better, while the smaller the value $K^2$, the greater the deterioration.

With regard to the sample (c) with a relatively deteriorated $K^2$, the SNDM image shows that the polarization strength is lower than those for samples (a) and (b). The average value of the polarization strength is −831 mV indicating that the polarization strength and the electromechanical coupling factor are correlated with each other. FIG. 7 is a graph showing the correlation between polarization strength and electromechanical coupling factor. The solid line represents an approximation line based on the plot of actual measurement. The ideal saturation value of the electromechanical coupling factor for C-plane AlN is about 0.25%, and in order to achieve this value, the absolute value of the polarization strength is required to be controlled at 2000 mV (or 1.27×10$^{-20}$ F/V or 80%) or higher. FIG. 8 is a graph showing the growth temperature and the polarization strength. It is understood that in order to secure the polarization strength of at least 2000 mV for obtaining the ideal electromechanical coupling factor, the growth temperature of not lower than 1100° C. is required for the +C plane growth and not lower than 600° C. for the −C plane growth.

As understood from the foregoing description, the polarization strength and the electromechanical coupling factor are correlated with each other and the polarization strength is required to be controlled at 2000 mV (or 1.27×10$^{-20}$ F/V or 80%) or higher to obtain the ideal electromechanical coupling factor. Also, the +C plane growth requires the growth temperature of not lower than 1100° C. so that the polarization strength can be controlled at 2000 mV (or 1.27×10$^{20}$ F/V or 80%).

The electromechanical coupling factor, on the other hand, is desirably not less than 0.1% (not smaller than about 1000 mV (or 0.63×10$^{-20}$ F/V) in terms of the absolute value of polarization strength) taking the device characteristics into consideration. As far as this value is satisfied, the required characteristics of the filter of the oscillator used with, for example, a mobile communication terminal can be obtained. Further, a value of not less than 0.2% substantially doubles the range of the application band as compared with the case of 0.1%. Furthermore, a value of not less than 0.5% or 1.0% makes possible a still wider application to the intermediate frequency filter of a mobile communication terminal.

Figure 9:
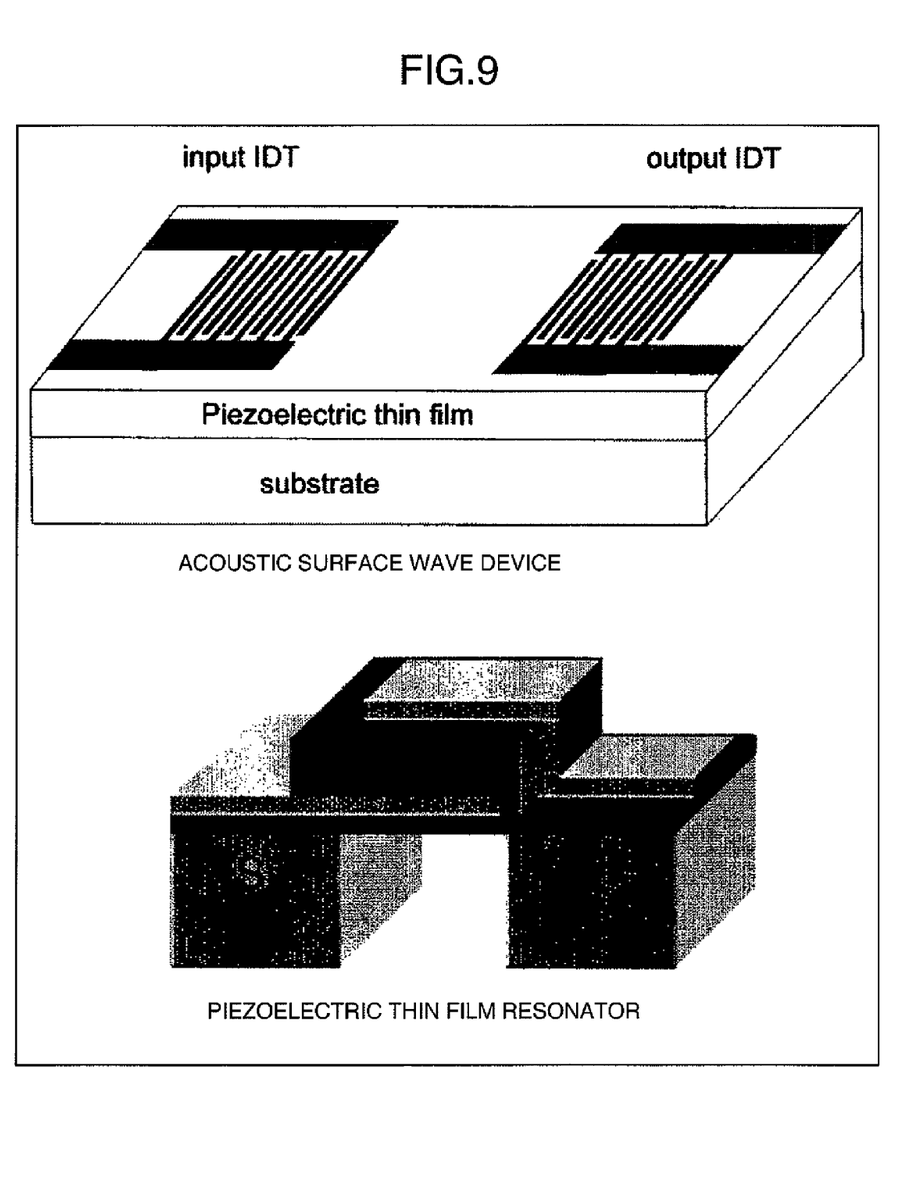
FIG. 9 is a diagram showing an application of the acoustic wave device according to this embodiment.

Although the proportional relation between the maximum value 3000 mV (or 1.89×10$^{-20}$ F/V) of the absolute value of polarization strength and the maximum value 0.25% of electromechanical coupling factor is plotted as a graph in FIG. 7, a similar proportional relation can be sustained for larger values. The electromechanical coupling factor of 1.0% for 10000 mV (or 6.3×10$^{20}$ F/V) in the absolute value of the polarization strength and the electromechanical coupling factor of 2.0% for 20000 mV (or 1.26×10$^{-19}$° F./V) in the absolute value of the polarization strength are some examples. The electromechanical coupling factor, however, is limited to about 5.0% for AlN, about 3.0% for ZnO and about 1.0% for GaN, each of which is the upper limit for the corresponding material. An application of the acoustic wave device using this piezoelectric thin film is shown in FIG. 9. An acoustic surface wave device and a piezoelectric thin film resonator are main examples of possible application. The control technique and the applications described above are true also with other piezoelectric thin films of such materials as ZnO and GaN as well as the AlN film.

Figure 12:
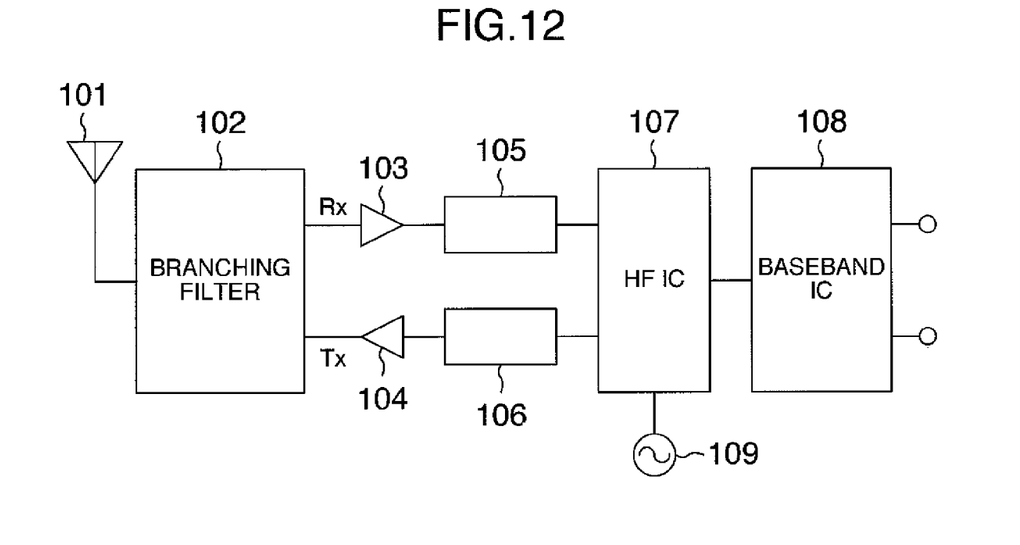
FIG. 12 is a block diagram showing a mobile communication unit.
Figure 13:
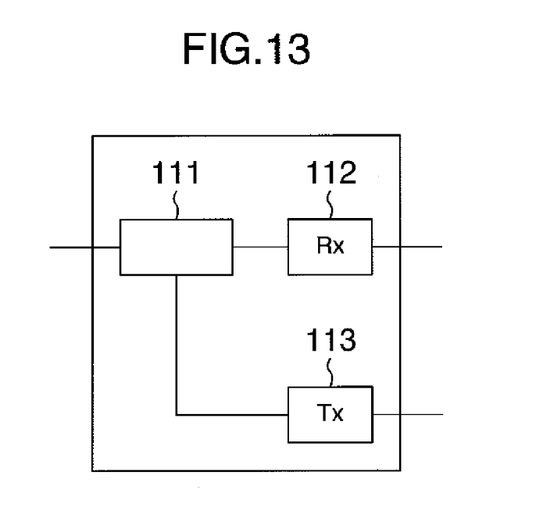
FIG. 13 is a diagram showing a configuration of a Duplexer.

FIG. 12 shows a configuration using the piezoelectric acoustic wave device for a mobile communication unit according to this embodiment. Numeral 101 designates an antenna for receiving a radio wave, numeral 102 a Duplexer, numeral 103 a low-noise amplifier, numeral 104 a power amplifier, numerals 105, 106 filters between receiving stage, numeral 107 an RF IC, numeral 108 a baseband IC and numeral 109 an oscillator for driving the RF IC. The Duplexer 102 is shown in detail in FIG. 13. Numeral 111 designates a phase shifter, numeral 112 a receiving top filter and numeral 113 a transmission top filter. The piezoelectric acoustic wave device according to this embodiment is used for the receiving top filter 112, the transmission top filter 113 and also the filter of the oscillator 109. As described above, the use of the piezoelectric acoustic wave device according to this embodiment provides a reliable mobile communication unit.

This invention is described above with reference to embodiments, to which the invention is not limited. It is apparent to those skilled in the art that this invention can be altered or modified variously without departing from the spirit and the scope of the appended claim.

We claim:

1. A piezoelectric thin-film acoustic wave device, wherein a nonlinear dielectric constant corresponding to the polarization strength of a piezoelectric thin film is not lower than $0.63 \times 10^{-20}$ F/V, and wherein the piezoelectric thin film is formed on the +C plane of the crystal of the piezoelectric thin film.

2. A piezoelectric thin-film acoustic wave device according to claim 1,
   wherein the piezoelectric thin film is formed at the temperature not lower than 600° C.

3. A piezoelectric thin-film acoustic wave device according to claim 1,
   wherein the piezoelectric thin film is nitrided at the temperature of not lower than 1200° C. and subsequently formed at the temperature of not lower than 600° C.

4. An information processing unit comprising the piezoelectric thin-film acoustic wave device according to claim 1.

5. An information processing unit comprising the piezoelectric thin-film acoustic wave device according to claim 3.

6. A piezoelectric thin-film acoustic wave device, wherein:
   a nonlinear dielectric constant corresponding to the polarization strength of a piezoelectric thin film is not lower than $0.63 \times 10^{-20}$ F/V;
   the piezoelectric thin film is formed of a selected one of AlN, ZnO and GaN; and
   the piezoelectric thin film is formed at the temperature not lower than 600° C.

7. A piezoelectric thin-film acoustic wave device, wherein:
   a nonlinear dielectric constant corresponding to the polarization strength of a piezoelectric thin film is not lower than $0.63 \times 10^{-20}$ F/V;
   the piezoelectric thin film is formed of a selected one of AlN, ZnO and GaN; and
   the piezoelectric thin film is nitrided at the temperature of not lower than 1200° C. and subsequently formed at the temperature of not lower than 600° C.

8. An information processing unit comprising:
   the piezoelectric thin-film acoustic wave device including a nonlinear dielectric constant corresponding to the polarization strength of a piezoelectric thin film is not lower than $0.63 \times 10^{-20}$ F/V, and
   wherein the piezoelectric thin film is formed of a selected one of AlN, ZnO and GaN.

* * * * *